(12) United States Patent
Utsunomiya

(10) Patent No.: US 10,756,713 B2
(45) Date of Patent: Aug. 25, 2020

(54) CLOCK SIGNAL BOOST CIRCUIT

(71) Applicant: ABLIC Inc., Chiba-shi, Chiba (JP)

(72) Inventor: Fumiyasu Utsunomiya, Chiba (JP)

(73) Assignee: ABLIC INC., Chiba (JP)

( * ) Notice: Subject to any disclaimer, the term of this patent is extended or adjusted under 35 U.S.C. 154(b) by 0 days.

(21) Appl. No.: 16/526,385

(22) Filed: Jul. 30, 2019

(65) Prior Publication Data

US 2020/0052679 A1    Feb. 13, 2020

(30) Foreign Application Priority Data

Aug. 8, 2018    (JP) .................. 2018-149741

(51) Int. Cl.
*G06F 1/06* (2006.01)
*H03K 5/02* (2006.01)

(52) U.S. Cl.
CPC .............. *H03K 5/023* (2013.01); *G06F 1/06* (2013.01)

(58) Field of Classification Search
CPC .................. H03K 5/023; G06F 1/06
See application file for complete search history.

(56) References Cited

U.S. PATENT DOCUMENTS 7,728,652 B2 *    6/2010    Sohara .................. H02M 3/07
327/536

FOREIGN PATENT DOCUMENTS

JP    H09-008229 A    1/1997

* cited by examiner

*Primary Examiner* — Dinh T Le
(74) *Attorney, Agent, or Firm* — Brinks Gilson & Lione

(57) ABSTRACT

A clock signal boost circuit includes a first NMOS transistor having a drain to a power terminal, a source to a first node, and a gate to a first terminal, a second NMOS transistor having a drain to the first node, a source to a GND, and a gate to a second terminal, a third NMOS transistor having a drain to the power terminal, a source to a second node, and a gate to the second terminal, a capacitor between the first node and the second node, a PMOS transistor having a source to the second node, a drain to an output terminal, and a gate to the second terminal, and a fourth NMOS transistor having a drain to the output terminal, a source to the GND, and a gate to the second terminal. The first and the third NMOS transistors are depletion type NMOS transistors.

2 Claims, 4 Drawing Sheets

PRIOR ART

CLOCK SIGNAL BOOST CIRCUIT

RELATED APPLICATIONS

Priority is claimed on Japanese Patent Application No. 2018-149741, filed on Aug. 8, 2018, the content of which is incorporated herein by reference.

BACKGROUND OF THE INVENTION

1. Field of the Invention

The present invention relates to a clock signal boost circuit.

2. Description of the Related Art

FIG. 4 is a circuit diagram of a conventional clock signal boost circuit in prior art.

The conventional clock signal boost circuit 400 includes PMOS transistors 401, 404, 405, and 407, NMOS transistors 402, 406, and 408, and a capacitor 403.

A clock signal Φ− supplied from an input terminal 41 is assumed to be a rectangular wave having an amplitude between a voltage Vdd of a power supply terminal 1 and a voltage VGND of a GND terminal 2.

Transition of the voltage of the clock signal Φ− to Vdd turns off the PMOS transistor 401, and turns on the NMOS transistor 402, so that the voltage of a node N41 becomes VGND. Further, the PMOS transistor 405 turns off, and the NMOS transistor 406 turns on, so that the voltage of a node N43 becomes VGND. The PMOS transistor 404 is therefore turned on so that the voltage of a node N42 becomes Vdd. Further, since the PMOS transistor 407 turns off, and the NMOS transistor 408 turns on, the voltage of an output terminal 42 becomes VGND.

Next, transition of the voltage of the clock signal Φ− to VGND turns on the PMOS transistor 401, and turns off the NMOS transistor 402, so that the voltage of the node N41 becomes Vdd. Since the voltage of the node N41 changes from VGND to Vdd, the voltage of the node N42 rises to 2Vdd by capacitance coupling of the capacitor 403.

Also, the PMOS transistor 405 turns on, and the NMOS transistor 406 turns off, so that the voltage of the node N43 becomes 2Vdd of the node N42, thereby turning off the PMOS transistor 404. Further, since the PMOS transistor 407 turns on, and the NMOS transistor 408 turns off, the voltage of the output terminal 42 becomes 2Vdd of the node N42.

As described above, the clock signal boost circuit 400 provides, from the output terminal 42, a signal 2Φ whose signal voltage alternately takes VGND and 2Vdd according to the supplied clock signal Φ− whose signal voltage alternately takes Vdd and VGND (refer to FIG. 23 of Japanese Patent Application Laid-Open No. H 09-008229).

SUMMARY OF THE INVENTION

In the conventional clock signal boost circuit 400, however, consideration was not made for an operation at the voltage Vdd of the power supply terminal 1 which is less than the absolute value of the threshold voltage of the PMOS transistors 401 and 404.

An object of the present invention is to provide a clock signal boost circuit capable of operation even at the voltage Vdd of the power supply terminal which is less than the absolute value of the threshold voltage of the PMOS transistor.

According to one aspect of the present invention, there is provided a clock signal boost circuit which includes a first input terminal supplied with a first clock signal, a second input terminal supplied with a second clock signal having a negative phase to the first clock signal, a first NMOS transistor having a drain connected to a power supply terminal, a source connected to a first node, and a gate connected to the first input terminal, a second NMOS transistor having a drain connected to the first node, a source connected to a GND terminal, and a gate connected to the second input terminal, a third NMOS transistor having a drain connected to the power supply terminal, a source connected to a second node, and a gate connected to the second input terminal, a capacitor connected between the first node and the second node, a PMOS transistor having a source connected to the second node, a drain connected to an output terminal, and a gate connected to the second input terminal, and a fourth NMOS transistor having a drain connected to the output terminal, a source connected to the GND terminal, and a gate connected to the second input terminal, and in which the first NMOS transistor and the third NMOS transistor are depletion type NMOS transistors.

Since the depletion type NMOS transistors are used to charge the capacitor and boost the voltage of the node, the clock signal boost circuit of the present invention can operate even at the voltage Vdd of the power supply terminal which is less than the absolute value of the threshold voltage of the PMOS transistor.

DETAILED DESCRIPTION OF THE PREFERRED EMBODIMENTS

Embodiments of the present invention will hereinafter be described with reference to the accompanying drawings.

Figure 1:
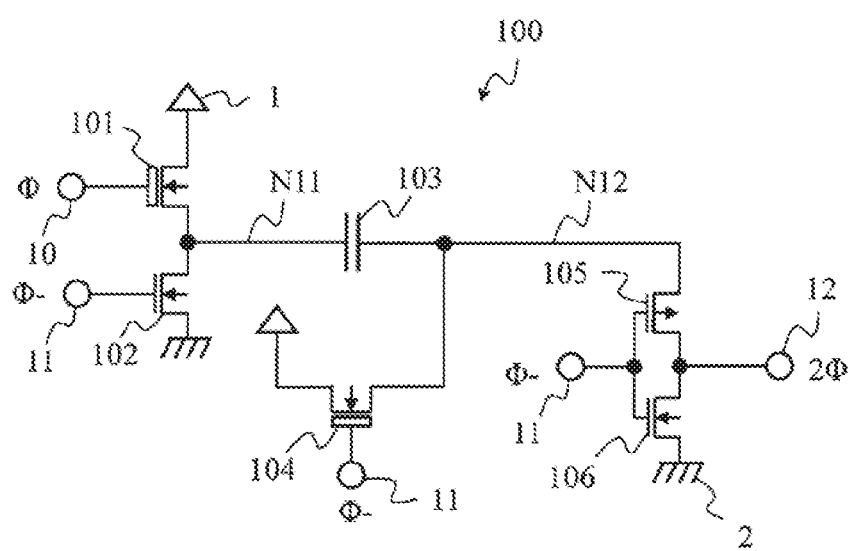
FIG. 1 is a circuit diagram illustrating a clock signal boost circuit of a first embodiment.

FIG. 1 is a circuit diagram illustrating a clock signal boost circuit 100 of the first embodiment of the present invention.

The clock signal boost circuit 100 includes depletion type NMOS transistors 101 and 104, NMOS transistors 102 and 106, a capacitor 103, and a PMOS transistor 105. In the following each MOS transistor is an enhancement type unless otherwise specified as a depletion type.

The depletion type NMOS transistor 101 has a source connected to a node N11, a drain connected to a power source terminal 1, and a gate connected to an input terminal 10. The NMOS transistor 102 has a source connected to a GND terminal 2, a drain connected to the node N11, and a gate connected to an input terminal 11. The depletion type NMOS transistor 104 has a source connected to a node N12, a drain connected to the power supply terminal 1, and a gate connected to the input terminal 11. The capacitor 103 is connected between the node N11 and the node N12. The PMOS transistor 105 has a source connected to the node N12, a drain connected to an output terminal 12, and a gate connected to the input terminal 11. The NMOS transistor 106 has a source connected to the GND terminal 2, a drain connected to the output terminal 12, and a gate connected to the input terminal 11.

The power supply terminal 1 is supplied with a voltage Vdd from a power supply. The GND terminal 2 is supplied with a voltage VGND from the power supply. The input terminal 10 receives a clock signal Φ. The input terminal 11 receives a clock signal Φ– having a negative phase to the clock signal Φ.

Next, the operation of the clock signal boost circuit 100 will be described.

First, transition of the voltage the clock signal Φ to the minimum value VGND, and transition of the voltage of the clock signal Φ– to the peak value Vdd, turn on the NMOS transistor 102 though the depletion type NMOS transistor 101 is not completely turned off, so that the voltage of the node N11 becomes the voltage VGND due to a difference in driving capability therebetween. Further, since the depletion type NMOS transistor 104 turns on, the voltage of the node N12 becomes Vdd. At this time, since the depletion type NMOS transistor 104 is used as a transistor which charges the capacitor 103, the capacitor 103 can be charged to the voltage Vdd even if the gate voltage is Vdd. Then, since the PMOS transistor 105 turns off, and the NMOS transistor 106 turns on, the voltage of the output terminal 12 becomes VGND.

Next, transition of the voltage of the clock signal Φ to the peak value Vdd, and transition of the voltage of the clock signal Φ– to the minimum value VGND, the depletion type NMOS transistor 101 turns on, and the NMOS transistor 102 turns off so that the voltage of the node N11 becomes Vdd. At this time, since the depletion type NMOS transistor 101 is a transistor which boosts the node N11, the voltage of the node N11 can be brought to Vdd even if the gate voltage is Vdd. Since the voltage of the node N11 changes to Vdd from VGND, the voltage of the node N12 rises to 2Vdd by capacitance coupling of the capacitor 103. Then, since the PMOS transistor 105 turns on, and the NMOS transistor 106 turns off, a clock signal 24 having the voltage 2Vdd is supplied from the output terminal 12. At this time, the depletion type NMOS transistor 104 completely turns off because the source voltage becomes Vdd of the power supply terminal 1, the drain voltage becomes 2Vdd, and the gate voltage becomes VGND.

As described above, the clock signal boost circuit 100 of the first embodiment can double the peak value of the supplied clock signal C to thereby provide the clock signal 24.

Further, since the depletion type NMOS transistor is used as a transistor to charge the capacitor 103 and boost the voltage of the node N11, the clock signal boost circuit 100 can operate even at the voltage Vdd which is less than the absolute value of the threshold voltage of the PMOS transistor.

Figure 2:
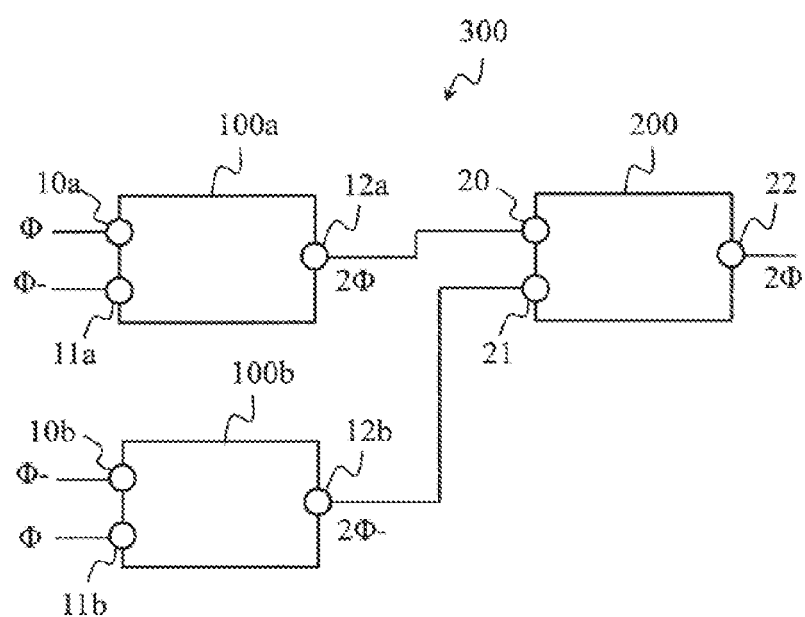
FIG. 2 is a circuit block diagram of a clock signal boost circuit of a second embodiment.

FIG. 2 is a block diagram illustrating a clock signal boost circuit 300 of the second embodiment.

In the clock signal boost circuit 100 of the first embodiment the NMOS transistors are the depletion type so as to operate even at the low voltage as described above. However current consumption increases if the size of the transistor is increased to drive a large load capacity. The clock signal boost circuit 300 of the second embodiment has a configuration which can drive a large load capacity while current consumption being small.

The clock signal boost circuit 300 of the second embodiment includes the clock signal boost circuits 100a and 100b according to the first embodiment, and a clock signal boost circuit 200 for a subsequent stage.

The clock signal boost circuit 100a receives a clock signal C at an input terminal 10a, receives a clock signal Φ– at an input terminal 11a, and supplies a clock signal 204 obtained by boosting the peak value of the clock signal Φ to two times from the output terminal 12a. The clock signal boost circuit 100b receives the clock signal Φ– at an input terminal 10b, receives the clock signal Φ at an input terminal 11b, and supplies a clock signal 2Φ– obtained by boosting the peak value of the clock signal Φ– to two times from the output terminal 12b. The clock signal boost circuit 200 for the subsequent stage receives the clock signal 24 at an input terminal 20, receives the clock signal 2Φ– at an input terminal 21, and supplies the clock signal 2Φ from the output terminal 22.

Figure 3:
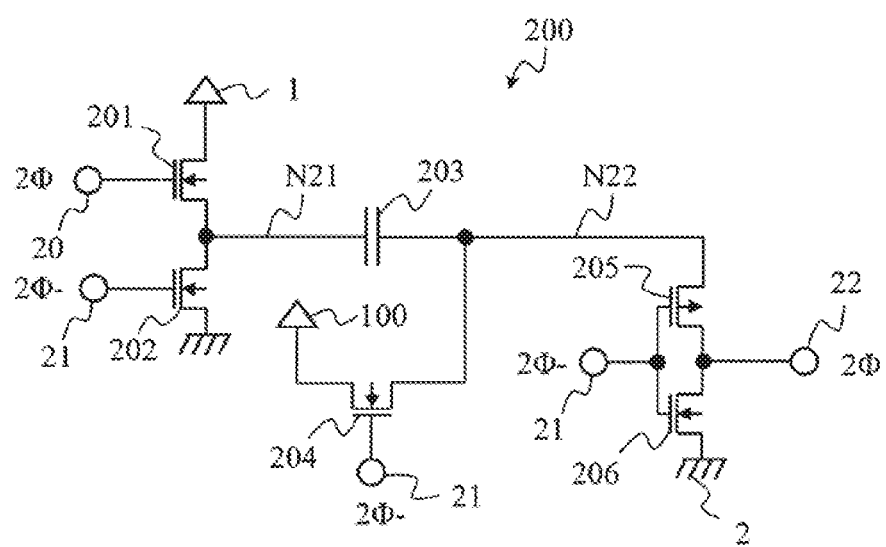
FIG. 3 is a circuit diagram illustrating a clock signal boost circuit for a subsequent stage employed in the second embodiment.
Figure 4:
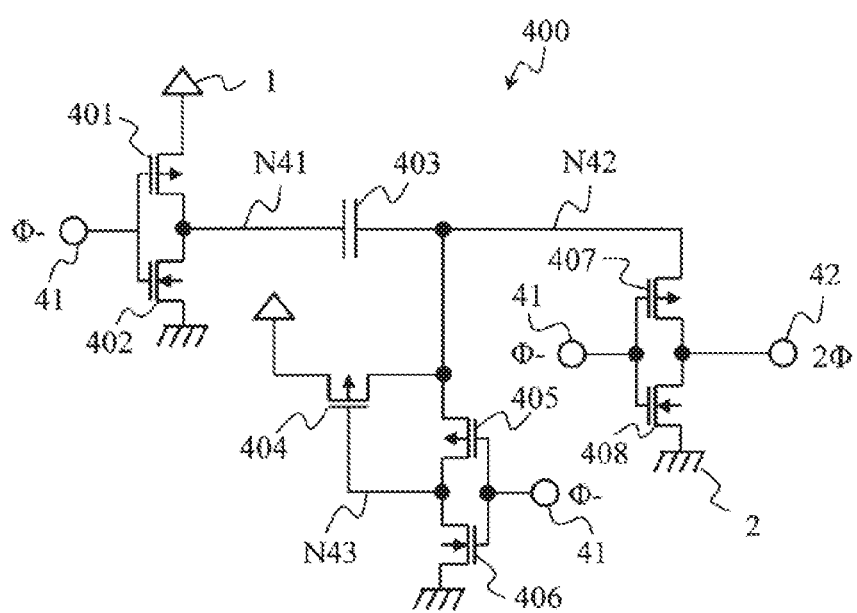
FIG. 4 is a circuit diagram illustrating a clock signal boost circuit in prior art.

FIG. 3 is a circuit diagram illustrating the clock signal boost circuit 200 for the subsequent stage.

The clock signal boost circuit 200 includes NMOS transistors 201, 202, 204, and 206, a capacitor 203, and a PMOS transistor 205.

The clock signal boost circuit 200 for the subsequent stage is similar in circuit configuration to the clock signal boost circuit 100 except that all the NMOS transistors are constituted from enhancement type transistors. A detailed description of the clock signal boost circuit 200 will therefore be omitted.

Since the peak values of the supplied clock signals 2Φ and 2Φ– turn to a voltage from VGND to 2Vdd, the clock signal boost circuit 200 functions without any problem even though the NMOS transistors 201 and 204 are the enhancement type. Further, the clock signal boost circuit 200 can enhance output drive capability by increasing the size of the NMOS transistors 201 and 204.

As described above, since the clock signal boost circuit 300 of the second embodiment supplies the clock signals 2Φ which is obtained from 2Φ and 2Φ– provided from the clock signal boost circuits 100a and 100b via the clock signal boost circuit 200, a large load capacity can be driven by the clock signal boost circuit 200 even though the clock crest value boost circuit 100 is small in output drive capability. The clock signal boost circuit 300 is therefore capable of driving a large load capacity while current consumption being small.

The embodiments of the present invention have been described above, the present invention is however not limited to the above embodiments. It is needless to say that various changes can be made thereto within the scope not departing from the gist of the present invention.

For example, in the clock signal boost circuit 200, the NMOS transistor 204 may be a depletion type. In that case, since the clock signal boost circuit 200 can operate if the clock signal 2Φ– is switched to the clock signal Φ–, the clock signal boost circuit 100b may be eliminated from the clock signal boost circuit 300.

What is claimed is:
1. A clock signal boost circuit comprising:
a first input terminal supplied with a first clock signal;
a second input terminal supplied with a second clock signal having a negative phase to the first clock signal;
a first NMOS transistor having a drain connected to a power supply terminal, a source connected to a first node, and a gate connected to the first input terminal;

a second NMOS transistor having a drain connected to the first node, a source connected to a GND terminal, and a gate connected to the second input terminal;

a third NMOS transistor having a drain connected to the power supply terminal, a source connected to a second node, and a gate connected to the second input terminal;

a capacitor connected between the first node and the second node;

a PMOS transistor having a source connected to the second node, a drain connected to an output terminal, and a gate connected to the second input terminal; and a fourth NMOS transistor having a drain connected to the output terminal, a source connected to the GND terminal, and a gate connected to the second input terminal, wherein the first NMOS transistor and the third NMOS transistor are depletion type NMOS transistors.

2. A multi-stage clock signal boost circuit comprising:

the clock signal boost circuit according to claim 1 being a first clock signal boost circuit for a first stage; and a second clock signal boost circuit for a subsequent stage which receives a clock signal supplied from the output terminal of the first clock signal boost circuit, wherein the second clock signal boost circuit for the subsequent stage has the same configuration as that of the first clock signal boost circuit, except that at least the first NMOS transistor of the second clock signal boost circuit is an enhancement type NMOS transistor.

* * * * *